US009905837B2

(12) United States Patent
Moriwaki

(10) Patent No.: US 9,905,837 B2
(45) Date of Patent: Feb. 27, 2018

(54) IMAGING ELEMENT, SOLID-STATE IMAGING DEVICE, AND ELECTRONIC DEVICE

(71) Applicant: SONY CORPORATION, Tokyo (JP)

(72) Inventor: Toshiki Moriwaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/319,681

(22) PCT Filed: Aug. 18, 2015

(86) PCT No.: PCT/JP2015/073072
§ 371 (c)(1),
(2) Date: Dec. 16, 2016

(87) PCT Pub. No.: WO2016/027793
PCT Pub. Date: Feb. 25, 2016

(65) Prior Publication Data

US 2017/0179463 A1 Jun. 22, 2017

(30) Foreign Application Priority Data

Aug. 21, 2014 (JP) ................................ 2014-168283
Jul. 17, 2015 (JP) ................................ 2015-142580

(51) Int. Cl.

| | |
|---|---|
| ***H01L 31/09*** | (2006.01) |
| ***H01L 29/24*** | (2006.01) |
| ***H01L 27/14*** | (2006.01) |
| ***H01M 4/02*** | (2006.01) |
| ***H01M 4/48*** | (2010.01) |
| ***H01L 27/146*** | (2006.01) |
| ***H01B 1/08*** | (2006.01) |

(52) U.S. Cl.
CPC ................ *H01M 4/02* (2013.01); *H01B 1/08* (2013.01); *H01L 27/14625* (2013.01); *H01L 27/14685* (2013.01); *H01L 29/247* (2013.01); *H01L 31/095* (2013.01); *H01M 4/48* (2013.01)

(58) Field of Classification Search
CPC ....... H01L 31/00; H01L 31/075; H01L 31/09; H01L 31/095; H01L 29/24; H01L 29/247; H01L 27/14; H01L 27/146; H01L 27/1462; H01L 27/1468; H01L 27/14625; H01L 27/14685; H01M 4/02; H01M 4/48; H01B 1/08
USPC .......................................................... 257/459
See application file for complete search history.

(56) References Cited

U.S. PATENT DOCUMENTS

2016/0049449 A1* 2/2016 Kim ..................... H01L 27/307 257/40

FOREIGN PATENT DOCUMENTS

JP 2007-067194 A 3/2007
JP 2008-227091 A 9/2008
(Continued)

OTHER PUBLICATIONS

International Search Report prepared by the Japan Patent Office dated Oct. 28, 2015, for International Application No. PCT/JP2015/073072.

*Primary Examiner* — Monica D Harrison
(74) *Attorney, Agent, or Firm* — Sheridan Ross P.C.

(57) ABSTRACT

An imaging element has a laminated structure including a first electrode, a light-receiving layer formed on the first electrode, and a second electrode formed on the light-receiving layer. The second electrode is made of a transparent amorphous oxide having a conductive property.

20 Claims, 9 Drawing Sheets

22
13 21 12 23 22B 22A
10
11

(56) References Cited

FOREIGN PATENT DOCUMENTS

| | | | |
|---|---|---|---|
| JP | 2008-288253 | A | 11/2008 |
| JP | 2010-258438 | A | 11/2010 |
| JP | 2013-201001 | A | 10/2013 |
| JP | 2014-220488 | A | 11/2014 |

* cited by examiner

IMAGING ELEMENT, SOLID-STATE IMAGING DEVICE, AND ELECTRONIC DEVICE

CROSS REFERANCE TO RELATED APPLICATIONS

This application is a national stage application under 35 U.S.C 371 and claims the benefit of PCT Application No. PCT/JP2015/073072 having an international filing date of 18 Aug. 2015, which designated the United States, which PCT application claimed the benefit of Japanese Patent Application No. 2014-168283 filed 21 Aug. 2014, and Japanese Patent Application No. 2015-142580 filed 17 Jul. 2015, the disclosure of which are incorporated herein by reference in their entirety.

TECHNICAL FIELD

This disclosure relates to an imaging element, a solid-state imaging device, and an electronic device.

BACKGROUND ART

An imaging element constituting an image sensor and the like has a structure of, for example, interposing a light-receiving layer (a photoelectric conversion layer) by two electrodes. Such imaging element includes a transparent electrode to which light enters usually constituted of a crystalline ITO. However, such transparent electrode has a large internal stress. This generates stress damage to the light-receiving layer, often deteriorating a characteristic of the imaging element. An imaging element (a photoelectric conversion element) to solve such problem caused by the internal stress from the transparent electrode has been well-known from, for example, Japanese Patent Application Laid-Open No. 2010-003901. That is, the imaging element (the photoelectric conversion element) disclosed in this patent publication includes a photoelectric conversion layer, which is disposed between a pair of electrodes, and at least one stress buffer layer, which is interposed between one of the pair of electrodes and the photoelectric conversion layer.

The stress buffer layer has a laminated structure including crystalline layers, specifically, a structure that laminates each two layers of the crystalline layers and amorphous layers (four layers in total) in alternation.

CITATION LIST

Patent Document

Patent Document 1: Japanese Patent Application Laid-Open No. 2010-003901

SUMMARY OF THE INVENTION

Problems to be Solved by the Invention

However, according to the technique disclosed in the above-described patent publication, the stress buffer layer has at least four-layer constitution; therefore, the structure is complex. This makes a formation process complex and causes a problem of requiring long time to form the stress buffer layer.

Accordingly, an object of the present disclosure is to provide an imaging element that is less likely to generate stress damage in a light-receiving layer and the like while having a simple structure, a solid-state imaging device that includes this imaging element, and an electronic device.

Solutions to Problems

An imaging element of the present disclosure for achieving the above object includes a laminated structure including a first electrode, a light-receiving layer formed on the first electrode, and a second electrode formed on the light-receiving layer, wherein the second electrode is made of a transparent amorphous oxide having a conductive property.

A solid-state imaging device of the present disclosure for achieving the above object includes a plurality of imaging elements, wherein the imaging elements each have a laminated structure including a first electrode, a light-receiving layer formed on the first electrode, and a second electrode formed on the light-receiving layer, and the second electrode is made of a transparent amorphous oxide having a conductive property.

An electronic device of the present disclosure for achieving the above object includes a laminated structure including a first electrode, a light-emitting/light-receiving layer formed on the first electrode, and a second electrode formed on the light-emitting/light-receiving layer, wherein the second electrode is made of a transparent amorphous oxide having a conductive property.

Effects of the Invention

With an imaging element of the present disclosure, an imaging element constituting a solid-state imaging device of the present disclosure, and an electronic device, since a second electrode is transparent and has a conductive property, this allows incident light to reliably reach a light-receiving layer or a light-emitting/light-receiving layer. Moreover, since the second electrode is made of amorphous oxide, internal stress at the second electrode decreases. Therefore, even without forming a stress buffer layer with complex configuration and structure, stress damage is less likely to occur in the light-receiving layer or the light-emitting/light-receiving layer during formation of the second electrode, free from a deterioration of characteristic of the imaging element and the electronic device. Further, since the second electrode is made of the amorphous oxide, a sealing property is improved. Consequently, compared with the case of configuring the second electrode with a transparent electrode with conventional crystalline, this feature ensures restraining unevenness in sensitivity in the imaging element and the electronic device. Note that the advantageous effects described in this description are merely an example and are not limited. Additionally, an additional advantageous effect may be provided.

BRIEF DESCRIPTION OF DRAWINGS

FIG. 3A illustrates measurement results of a light current, and FIG. 3B illustrates measurement results of a dark current.

MODE FOR CARRYING OUT THE INVENTION

Figure 1A:
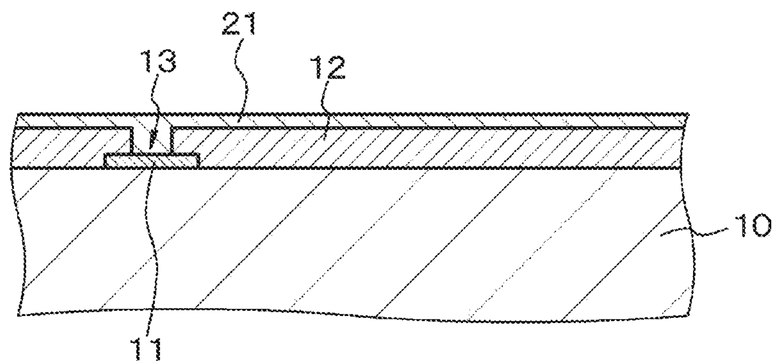
FIG. 1A and FIG. 1B are schematic, partial cross-sectional views of a substrate and the like to describe a method for manufacturing an imaging element and the like of a first embodiment.

The following describes the present disclosure on the basis of embodiments with reference to drawings. However, the present disclosure is not limited to the embodiments, and various values and materials in the embodiments are examples. Note that the following gives the explanation in the following order.

1. General Explanation on Imaging Device and Electronic Device of Present Disclosure
2. First Embodiment (Imaging Device and Electronic Device)
3. Second Embodiment (Modification of First Embodiment)
4. Third Embodiment (Solid-State Imaging Device of This disclosure)
5. Others <General Explanation on Imaging Device and Electronic Device of Present Disclosure>

With the imaging element of the present disclosure, the imaging element in the solid-state imaging device of the present disclosure, and the electronic device of his disclosure, when 0 volts are applied between a first electrode and a second electrode, a value of a dark current flowing between the first electrode and the second electrode is assumed as $J_{d-0}$ (ampere), and when 5 volts are applied between the first electrode and the second electrode, a value of the dark current flowing between the first electrode and the second electrode is assumed as $J_{d-5}$ (ampere). Then, a form meeting: $0.8 \leq J_{d-5}/J_{d-0} \leq 1.2$ can be configured. Additionally, when a voltage exceeding 0 volts to 5 volts or less is applied between the first electrode and the second electrode, a value of the dark current flowing between the first electrode and the second electrode is assumed as $J_d$ (ampere), $0.8 \leq J_d/J_{d-0} \leq 1.2$ is met. Here, the dark current can be obtained in a state where light is not irradiated, specifically, by measuring a current flowing between the first electrode and the second electrode when a reverse-bias voltage is applied between the first electrode and the second electrode under a state of dark place.

With the imaging element of the present disclosure, the imaging element in the solid-state imaging device of the present disclosure, or the electronic device of the present disclosure including the above-described preferable forms, a laminated structure is preferably has a form of having internal stress, compressive stress of 10 MPa to 50 MPa. This allows further reliably restraining stress damage in a light-receiving layer or a light-emitting/light-receiving layer during formation of the second electrode.

Further, with the imaging element of the present disclosure, the imaging element in the solid-state imaging device of the present disclosure, or the electronic device of the present disclosure including the above-described various preferable forms, surface roughness Ra of the second electrode preferably has a form of 1.5 nm or less and Rq of 2.5 nm or less. Note that, the surface roughness Ra and Rq are based on a specification in JIS B0601: 2013. Such smoothness of the second electrode can restrain surface diffuse reflectance in the second electrode and reduce surface reflection of the light entering the second electrode. This ensures restraining a loss of an amount of light of the light entering the light-receiving layer or the light-emitting/light-receiving layer via the second electrode and achieving an improvement in a light current characteristic in photoelectric conversion.

Further, with the imaging element of the present disclosure, the imaging element in the solid-state imaging device of the present disclosure, or the electronic device of the present disclosure including the above-described various preferable forms, a work function of the second electrode preferably has a form of 4.5 eV or less. Then, in this case, a value of the work function of the second electrode is further preferable to be 4.1 eV to 4.5 eV.

Further, with the imaging element of the present disclosure, the imaging element in the solid-state imaging device of the present disclosure, or the electronic device of the present disclosure including the above-described various preferable forms, optical transmittance of the second electrode with respect to light with wavelength of 400 nm to 660 nm is preferably 75% or more. Additionally, the optical transmittance of the first electrode with respect to light with wavelength of 400 nm to 660 nm is also preferably 75% or more.

Further, with the imaging element of the present disclosure, the imaging element in the solid-state imaging device of the present disclosure, or the electronic device of the present disclosure including the above-described various preferable forms, an electric resistance value of the second electrode is preferably $1\times10^{-6}\Omega\cdot cm$ or less. Alternatively, a sheet resistance value of the second electrode is preferably $3\times10\Omega/\square$ to $1\times10^{3}\Omega/\square$.

Further, with the imaging element of the present disclosure, the imaging element in the solid-state imaging device of the present disclosure, or the electronic device of the present disclosure including the above-described various preferable forms, a thickness of the second electrode is $1\times10^{-8}$ m to $1.5\times10^{-7}$ m and preferably $2\times10^{-8}$ m to $1\times10^{-7}$ m.

Further, with the imaging element of the present disclosure, the imaging element in the solid-state imaging device of the present disclosure, or the electronic device of the present disclosure including the above-described various preferable forms, the second electrode can have a constitution made of a material formed by adding or doping at least one kind of material selected from the group consisting of aluminum, gallium, tin, and indium to one kind of material selected from the group consisting of indium oxide, tin oxide, and zinc oxide.

Alternatively, with the imaging element of the present disclosure, the imaging element in the solid-state imaging device of the present disclosure, or the electronic device of the present disclosure including the above-described various preferable forms, the second electrode can have a constitution made of $In_a$ (Ga, Al)$_b$$Zn_c$$O_d$, that is, amorphous oxide constituted of quaternary compound at least constituted of indium (In), gallium (Ga) and/or aluminum (Al), zinc (Zn), and oxygen (O). Then, in this case, a difference between the value of the work function of the second electrode and a value of the work function of the first electrode is preferable to be 0.4 eV or more. Further, setting the difference between the value of the work function of the second electrode and the value of the work function of the first electrode to be 0.4 eV or more, when a bias voltage is applied between the second electrode and the first electrode, generates an internal electric field in the light-receiving layer or the light-emitting/light-receiving layer (hereinafter, these layers may be collectively referred to as a "light-receiving layer or the like") on the basis of the difference in value of the work function and ensures a configuration that improves internal quantum efficiency, ensuring further restraining generation of a dark current. Here, controlling an amount of introduced oxygen gas (an oxygen gas partial pressure) to form the second electrode by a sputtering method can achieve controlling the value of the work function of the second electrode.

Additionally, in the case where the second electrode has a constitution made of $In_a$(Ga, Al)$_b$$Zn_c$$O_d$, the second electrode can also be configured to have a laminated structure of a second B layer and a second A layer from a light-receiving layer or the like side, and a value of the work function of the second A layer in the second electrode can be lower than a value of the work function of the second B layer in the second electrode. Then, in this case, the difference between the value of the work function of the second A layer in the second electrode and the value of the work function of the second B layer in the second electrode can be configured to be 0.1 eV to 0.2 eV. Further, the difference between the value of the work function of the first electrode and the value of the work function of the second A layer in the second electrode can be configured to be 0.4 eV or more. Alternatively, setting the difference between the value of the work function of the first electrode and the value of the work function of the second A layer in the second electrode to 0.4 eV or more generates the internal electric field in the light-receiving layer or the like on the basis of the difference in the values of the work functions, allowing a configuration of achieving the improvement in internal quantum efficiency. Here, such control of the values of the work functions of the second A layer and the second B layer in the second electrode can be achieved by controlling the amount of introduced oxygen gas (the oxygen gas partial pressure) at formation by the sputtering method. Besides, a configuration where a thickness of the second electrode is $1\times10^{-8}$ m to $1.5\times10^{-7}$ m and a ratio of a thickness of the second A layer in the second electrode to a thickness of the second B layer in the second electrode is 9/1 to 1/9 can be employed. Note that, to reduce an influence of oxygen atoms and oxygen molecules to the light-receiving layer or the like, configuring the thickness of the second B layer thinner than the thickness of the second A layer in the second electrode is more preferable. Thus, the second electrode has a two-layer structure of the second A layer and the second B layer and the difference in the work function between the second B layer and the second A layer is specified. This ensures achieving an optimization of the work function in the second electrode, further easing an exchange (a movement) of carriers.

The electronic device of the present disclosure can constitute an optical sensor and an image sensor. Then, in this case, the light-emitting/light-receiving layer can be made of, for example, an organic photoelectric conversion material.

With the imaging element of the present disclosure, the imaging element in the solid-state imaging device of the present disclosure, or the electronic device of the present disclosure including the above-described various preferable forms and configurations (hereinafter these devices are collectively referred to as an "imaging element or the like of the present disclosure"), the light reception or the light emission/light reception of the light (in a larger sense, an electromagnetic wave including visible light, ultraviolet rays, and infrared) on the imaging element or the like is performed via the second electrode.

The imaging element or the like of the present disclosure can employ a form where the second electrode is made of a transparent conductive material, specifically, indium-gallium oxide (IGO), indium-doped gallium-zinc oxide (IGZO, In—$GaZnO_4$), aluminum oxide-doped zinc oxide (AZO), indium-zinc oxide (IZO), gallium-doped zinc oxide (GZO), and the like. The value of the work function of the second electrode made of these transparent conductive materials is, for example, 4.1 eV to 4.5 eV. Further, the imaging element or the like of the present disclosure including these forms can employ a form where the first electrode is made of the transparent conductive material such as indium-tin oxide (ITO), indium-zinc oxide (IZO), and tin oxide ($SnO_2$). The value of the work function of the first electrode made of these transparent conductive materials is, for example, 4.8 eV to 5.0 eV.

As described above, with the imaging element or the like of the present disclosure, controlling the amount of introduced oxygen gas (the oxygen gas partial pressure) to form the second electrode by the sputtering method can control the value of the work function of the second electrode. Additionally, controlling the amount of introduced oxygen gas (the oxygen gas partial pressure) to form the second electrode by the sputtering method can control the values of the work functions of the second A layer and the second B layer in the second electrode. Further, the imaging element or the like of the present disclosure can employ a form where a content rate of oxygen in the second electrode is less than a content rate of oxygen in a stoichiometric composition. Here, the value of the work function of the second electrode can be controlled on the basis of the content rate of oxygen. As the content rate of oxygen decreases more than the content rate of oxygen in the stoichiometric composition, that is, as an oxygen loss increases, the value of the work function decreases. Note that, the content rate of oxygen of the second A layer in the second electrode is lower than the content rate of oxygen of the second B layer in the second electrode.

The second electrode is formed by the sputtering method, specifically, a magnetron sputtering method and a parallel standard sheet sputtering method are applicable, and a plasma-generating formation method using a DC discharge method or an RF discharge method is applicable. Note that, the present disclosure has a major feature that the work function can be controlled by oxygen flow rate (the amount of introduced oxygen gas and the oxygen gas partial pressure).

As a method for forming the first electrode, although depending on the material constituting the first electrode, a PVD method such as a vacuum deposition method, a reactive deposition method, various sputtering methods, an electron beam evaporation method, and an ion plating method, various CVD methods including a pyrosol method, a method to thermally dissolve organic metal compounds, a spray method, a dip method, and a MOCVD method, an electroless plating method, and an electrolytic plating method are applicable.

To the electronic device of the present disclosure including the above-described various preferable forms and configurations, specifically, for example, a configuration where the first electrode is formed on a substrate, the light-receiving layer or the like is formed on the first electrode, and the second electrode is formed on the light-receiving layer or the like is applicable. That is, the electronic device of the present disclosure has a two-terminal type electronic device structure that includes the first electrode and the second electrode. However, the configuration is not limited to this. The electronic device may have a three-terminal type electronic device structure that further includes a control electrode. This makes it possible to modulate a flowing current by an application of a voltage to the control electrode. As three-terminal type electronic device structure, specifically, one with configuration and structure identical to so-called bottom gate/bottom contact type, bottom gate/top contact type, top gate/bottom contact type, or top gate/top contact type field-effect type transistor (FET) is applicable. Note that, while the second electrode can be functioned as a cathode electrode (cathode) (that is, functioned as an electrode that extracts the electrons), the first electrode can be functioned as an anode electrode (anode) (that is, functioned as an electrode that extracts holes). A structure where the light-receiving layer or the like is formed by lamination of a plurality of imaging elements and electronic devices that have different optical absorption spectra can also be employed. Besides, for example, a structure where the substrate is constituted of a silicon semiconductor substrate, driving circuits for the imaging elements and the electronic devices and the light-receiving layers or the like are disposed on this silicon semiconductor substrate, and the imaging elements and the electronic devices are laminated on this silicon semiconductor substrate can also be employed.

The light-receiving layer or the like may be in an amorphous state or may be a crystal state. As the organic material (the organic photoelectric conversion material) constituting the light-receiving layer or the like, an organic semiconductor material, an organic metal compound, and organic semiconductor microparticles are applicable. Alternatively, as the material constituting the light-receiving layer or the like, a metal oxide semiconductor, inorganic semiconductor microparticles, a material whose core member is coated with a shell member, and an organic-inorganic hybrid compound are also applicable.

Here, as the organic semiconductor material, specifically, an organic dye typified by quinacridone and its derivative, a dye formed by chelating an early period (indicates metal on the left in a periodic table) ion typified by Alq3[tris(8-quinolinolato) aluminum (III)] with an organic material, an organometallic dye complexly formed with transition metal ion typified by phthalocyanine zinc (II) and an organic material, dinaphthothienothiophene (DNTT), and the like are applicable.

As the organic metal compound, specifically, a dye formed by chelating the above-described early period ion with organic material and an organic metal dye formed by complex formation with the transition metal ion and the organic material are applicable. As the organic semiconductor microparticles, specifically, an aggregate of the organic dye typified by the above-described quinacridone and its derivative, an aggregate of the dye formed by chelating the early period ion with the organic material, an aggregate of the organic metal dye formed by complex formation with the transition metal ion and the organic material, or prussian blue formed by crosslinking of metal ion with cyano group and its derivative, or a composite aggregate of these materials is applicable.

As the metal oxide semiconductor or the inorganic semiconductor microparticles, specifically, ITO, IGZO, ZnO, IZO, $IrO_2$, $TiO_2$, $SnO_2$, $SiO_x$, metal chalcogen semiconductor containing chalcogen [for example, sulfur (S), selenium (Se), and tellurium (Te)] (specifically, CdS, CdSe, ZnS, CdSe/CdS, CdSe/ZnS, and PbSe), ZnO, CdTe, GaAs, and Si are applicable.

The material whose core member is coated with the shell member, that is, as a combination of (the core member and the shell member), specifically, an organic material such as (polystyrene and polyaniline) and a metallic material such as (a metallic material difficult to be ionized and a metallic material easily ionized) are applicable. As the organic-inorganic hybrid compound, specifically, the prussian blue formed by crosslinking of the metal ion with the cyano group and its derivative are applicable. Besides, a coordination polymer, a generic term for one formed by infinite crosslinking of metal ion with bipyridines, one formed by crosslinking of metal ion with multivalent ion acid typified by oxalic acid and rubeanic acid are applicable.

As a method for forming the light-receiving layer or the like, although depending on the used material, an application method, a physical vapor deposition method (the PVD method); and various chemical vapor deposition methods (the CVD methods) including an MOCVD method are applicable. Here, as the application method, specifically, a spin coat method; a soaking method; a cast method; various printing methods such as a screen-printing method, an inkjet printing method, an offset printing method, and a gravure printing method; a stamping method; a spray method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method can be exemplified. Note that, in the application method, as a solvent, nonpolar or low-polarity organic solvent such as toluene, chloroform, hexane, and ethanol can be exemplified. Additionally, as the PVD method, an electron beam heating method, a resistance heating method, and various vacuum deposition methods such as a flash evaporation; a plasma deposition method; various sputtering methods such as a two-pole sputtering method, a DC sputtering method, a DC magnetron sputtering method, a high frequency sputtering method, a magnetron sputtering method, an ion beam sputtering method, and a bias sputtering method; and various ion plating methods such as a direct current (DC) method, an RF method, a multi-cathode method, an activation reaction method, an electric field deposition method, a high frequency ion plating method, and a reactive ion plating method are applicable.

Although the thickness of the light-receiving layer or the like is not limited, for example, $1\times10^{-10}$ m to $5\times10^{-7}$ m can be exemplified.

As the substrate, an organic polymer exemplified by polymethylmethacrylate (polymethylmethacrylate, PMMA), polyvinyl alcohol (PVA), polyvinylphenol (PVP), polyethersulfone (PES), polyimide, polycarbonate (PC), polyethylene terephthalate (PET), and polyethylene naphthalate (PEN) (has a form of high-polymer material such as flexible plastic film, plastic sheet, and plastic substrate made of high-polymer material) are applicable. The use of the substrate made of such flexible high-polymer materials ensures an installation or integration of the electronic device to, for example, an electronic appliance with curved surface shape. Alternatively, as the substrate, various glass substrates, various glass substrates that form an insulating film on a surface thereof, a quartz substrate, a quartz substrate that forms an insulating film on a surface thereof, a silicon semiconductor substrate, a silicon semiconductor substrate that forms an insulating film on a surface thereof, and a metal substrate made of various alloys such as stainless steel and various metals are applicable. Note that, as the insulating film, a silicon oxide-based material (for example, $SiO_x$ and spin-on glass (SOG)); silicon nitride ($SiN_Y$); silicon oxynitride (SiON); aluminum oxide ($Al_2O_3$); metal oxide, and metal salt are applicable. Additionally, a conductive substrate that forms these insulating films on the surface thereof (a substrate made of metal such as gold and aluminum and a substrate made of highly oriented graphite) is also applicable. The surface of the substrate is preferably smooth; however, roughness to the extent that does not adversely affect the characteristic of the light-receiving layer or the like is acceptable. Adhesiveness between the first electrode and the substrate may be improved by forming a silanol derivative on the surface of the substrate by silane coupling method, forming a thin film made of a thiol derivative, a carboxylic acid derivative, a phosphoric acid derivative, and the like by a SAM method or the like, and forming a thin film made of insulating metal salt and metal complex by the CVD method or the like.

Depending on the case, a coating layer may coat the second electrode and the first electrode. As the material constituting the coating layer, not only an inorganic insulating material exemplified by a silicon oxide-based material; silicon nitride ($SiN_Y$); and a metal oxide high-dielectric insulating film such as aluminum oxide ($Al_2O_3$), but also an organic insulating material (organic polymer) exemplified by straight-chain hydrocarbons having on one end a functional group that can be bonded to a control electrode such as polymethylmethacrylate (PMMA); polyvinylphenol (PVP); polyvinyl alcohol (PVA); polyimide; polycarbonate (PC); polyethylene terephthalate (PET); polystyrene; a silanol derivative (a silane coupling agent) such as N-2(aminoethyl)3-aminopropyltrimethoxysilane (AEAPTMS), 3-mercaptopropyltrimethoxysilane (MPTMS), or octadecyltrichlorosilane (OTS); octadecanethiol, and dodecyl isocyanate are applicable. A combination of these can also be used. Note that, as the silicon oxide-based material, silicon oxide ($SiO_x$), BPSG, PSG, BSG, AsSG, PbSG, silicon oxynitride (SiON), SOG (spin-on glass), or a low-dielectric constant material (for example, polyarylether, cycloperfluorocarbon polymer and benzocyclobutene, a cyclic fluororesin, polytetrafluoroethylene, fluorinatedaryl ether, fluorinated polyimide, amorphous carbon, and organic SOG) can be exemplified. As the method for forming the insulating layer, any one of the above-described various PVD methods; various CVD methods; a spin coat method; the above-described various application methods; a sol-gel method; an electrodeposition method; a shadow mask method; and a spray method is applicable.

First Embodiment

The first embodiment relates to the imaging element of the present disclosure and the electronic device of the present disclosure. FIG. 1B illustrates a schematic, partial cross-sectional view of the imaging element or the electronic device of the first embodiment.

The imaging element and the electronic device of the first embodiment or an imaging element and an electronic device of a second embodiment, which will be described later, have a laminated structure including a first electrode 21, a light-receiving layer or a light-emitting/light-receiving layer (a light-receiving layer or the like 23) formed on the first electrode 21, and a second electrode 22, which is formed on the light-receiving layer or the like 23. Then, the second electrode 22 is made of a transparent amorphous oxide having conductive property. Here, the second electrode 22 is made of a material formed by adding or doping at least one kind of material selected from the group consisting of aluminum, gallium, tin, and indium to one kind of material selected from the group consisting of indium oxide, tin oxide, and zinc oxide. Alternatively, the second electrode 22 is made of $In_a(Ga, Al)_bZn_cO_d$. That is, the second electrode 22 is made of the amorphous oxide at least constituted of quaternary compound [$In_a(Ga, Al)_bZn_cO_d$] of indium (In), gallium (Ga) and/or aluminum (Al), zinc (Zn), and oxygen (O). Note that, "a," "b," "c," and "d" can be various values. Note that, 0.5 to 1 can be an example as the value of "a," 0.5 to 1 as the value of "b," 0.5 to 1 as the value of "c," and 4 to 7 as the value of "d"; however, values are not limited to these.

Here, more specifically, the imaging element and the electronic device of the first embodiment include the first electrode 21 formed on a substrate 10 formed of the silicon semiconductor substrate, the light-receiving layer or the like 23 formed on the first electrode 21, and the second electrode 22 formed on the light-receiving layer or the like 23. That is, the electronic device of the first embodiment or the second embodiment, which will be described later, has a two-terminal type electronic device structure that includes the first electrode 21 and the second electrode 22. Specifically, the light-receiving layer or the like 23 performs a photoelectric conversion. Then, in the electronic device of the first embodiment or the second embodiment, which will be described later, a difference between a value of the work function of the second electrode 22 and a value of the work function of the first electrode 21 is 0.4 eV or more. Here, setting the difference between the value of the work function of the second electrode 22 and the value of the work function of the first electrode 21 to 0.4 eV or more generates an internal electric field on the light-receiving layer or the like 23 on the basis of the difference in the values of the work functions, thus achieving improvement in internal quantum efficiency. The second electrode 22 functions as a cathode electrode (cathode). That is, the second electrode 22 functions as an electrode to extract electrons. On the other hand, the first electrode 21 functions as an anode electrode (anode). That is, the first electrode 21 functions as an electrode to extract holes. The light-receiving layer or the like 23 is made of an organic photoelectric conversion material, specifically, for example, quinacridone with thickness of 0.1 μm.

Further, the work function of the second electrode 22 is 4.5 eV or less, specifically, 4.1 eV to 4.5 eV. More specifically, in the first embodiment, the second electrode 22 is made of a transparent conductive material such as indium-zinc oxide (IZO) or indium-doped gallium-zinc oxide (IGZO). Additionally, the first electrode 21 is made of a transparent conductive material such as indium-tin oxide (ITO). Here, although depending on a film forming condition, a work function of IZO or IGZO is 4.1 eV to 4.3 eV. Further, although depending on a film forming condition, a work function of ITO is 4.8 eV to 5.0 eV. Note that, besides, as the material constituting the second electrode 22, a transparent conductive material such as aluminum oxide-doped zinc oxide (AZO), indium-gallium oxide (IGO) or gallium-doped zinc oxide (GZO) is applicable. Besides, as the material constituting the first electrode 21, a transparent conductive material such as indium-zinc oxide (IZO) and tin oxide ($SnO_2$) formed with a film forming condition different from the second electrode 22 is applicable. Note that, the above-described explanation is almost similar to the second embodiment, which will be described later.

Then, with the imaging element and the electronic device of the first embodiment or the second embodiment, which will be described later, optical transmittance of the second electrode 22 with respect to light with wavelength of 400 nm to 660 nm is 75% or more. Optical transmittance of the first electrode 21 with respect to the light with wavelength of 400 nm to 660 nm is also 75% or more. Forming films of the second electrode 22 and the first electrode 21 on a transparent glass plate ensures the measurement of the optical transmittance of the second electrode 22 and the first electrode 21. Additionally, an electric resistance value of the second electrode 22 is $1\times10^{-6}\Omega\cdot$cm or less, and a sheet resistance value of the second electrode 22 is $3\times10\Omega/\square$ to $1\times10^{3}\Omega/\square$. A thickness of the second electrode 22 is $1\times10^{-8}$ m to $1.5\times10^{-7}$ m and preferably $2\times10^{-8}$ m to $1\times10^{-7}$ m. Further, surface roughness Ra of the second electrode 22 is 1.5 nm or less and Rq is 2.5 nm or less. More specifically, the electric resistance value of the second electrode 22 made of IZO with thickness of 100 μm is $6\times10^{-6}\Omega\cdot$cm, and the sheet resistance value is $60\Omega/\square$. Additionally, the electric resistance value of the second electrode 22 made of IGZO with thickness of 100 μm is $2\times10^{-5}\Omega\cdot$cm, and the sheet resistance value is $2\times10^{2}\Omega/\square$.

Figure 1B:
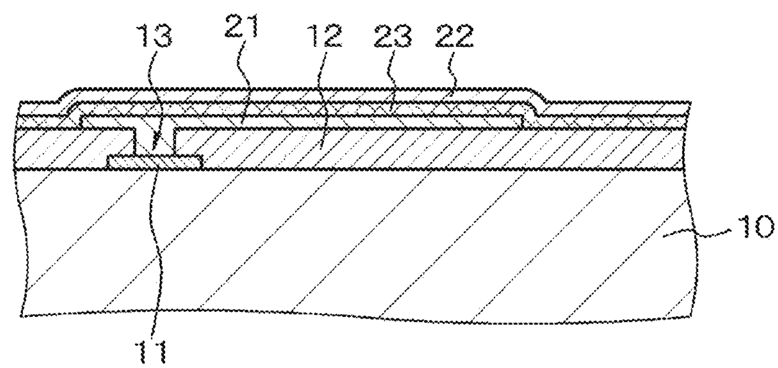

The following describes a method for manufacturing the imaging element and the electronic device of the first embodiment with reference to FIG. 1A and FIG. 1B.

[Process-100]

The substrate 10 formed of the silicon semiconductor substrate is prepared. Here, the substrate 10 includes, for example, a driving circuit for the imaging element and the electronic device, the light-receiving layer or the like (these members are not illustrated), and a wiring 11, and an insulating layer 12 is formed on a surface thereof. The insulating layer 12 has an opening 13 on a bottom portion thereof where the wiring 11 is exposed. Then, the first electrode 21 made of ITO is formed (film formation) over the insulating layer 12 including the inside of the opening 13 by the sputtering method (see FIG. 1A).

[Process-110]

Next, after performing patterning of the first electrode 21, the light-receiving layer or the like 23 made of quinacridone is formed (film formation) over an entire surface of the first electrode 21 by vacuum deposition method. Further, the second electrode 22 made of IZO or IGZO is formed (film formation) over the light-receiving layer or the like 23 by the sputtering method. Thus, the electronic device of the first embodiment with the structure illustrated in FIG. 1B can be obtained.

Figure 2:
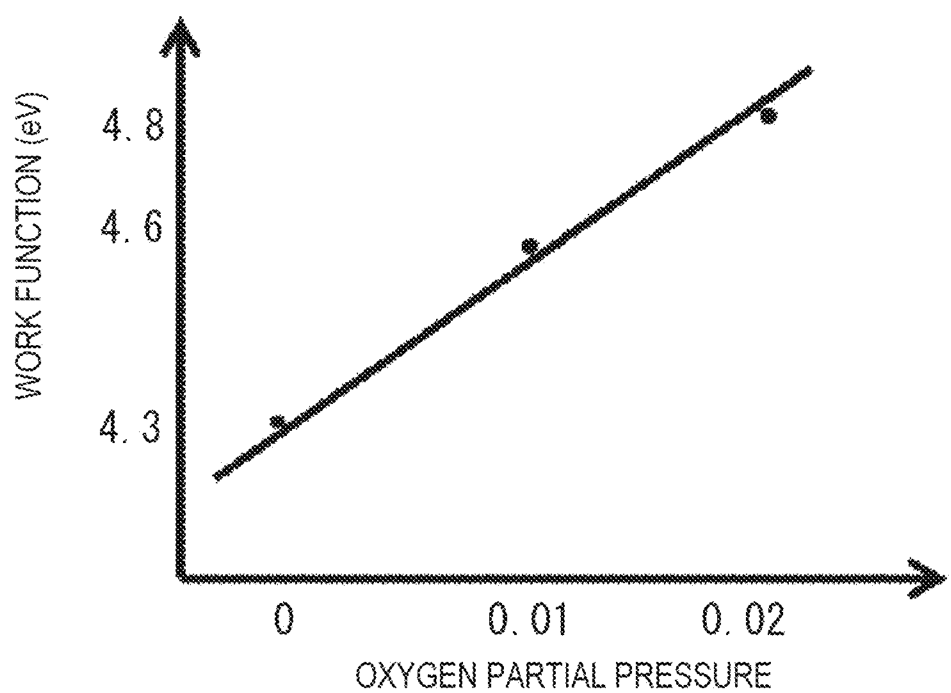
FIG. 2 is a graph illustrating an example of results of obtaining a relationship between an amount of introduced oxygen gas (oxygen gas partial pressure) and a value of a work function of a second electrode when a second electrode is formed by a sputtering method in the first embodiment.

Here, controlling the amount of introduced oxygen gas (the oxygen gas partial pressure) to form the second electrode 22 by the sputtering method controls the value of the work function of the second electrode 22. FIG. 2 illustrates the graph of an example of results obtaining a relationship between the oxygen gas partial pressure and the value of the work function of the second electrode 22 made of IGZO. As a value of the oxygen gas partial pressure increases, that is, as oxygen loss decreases, the value of the work function of the second electrode 22 increases. As the value of the oxygen gas partial pressure decreases, that is, as the oxygen loss increases, the value of the work function of the second electrode 22 decreases. Note that, as a sputtering device, a parallel standard sheet sputtering device or a DC magnetron sputtering device was employed, argon (Ar) gas was used as process gas, and an $InGaZnO_4$ sintered body was used as a target. Note that, a relationship between the oxygen gas partial pressure and the value of the work function of the second electrode 22 made of IZO also has a relationship similar to the relationship between the oxygen gas partial pressure and the value of the work function of the second electrode 22 made of IGZO.

Thus, with the electronic device of the first embodiment, controlling the amount of introduced oxygen gas (the oxygen gas partial pressure) to form the second electrode 22 by the sputtering method controls the value of the work function of the second electrode 22. Note that, in the second electrode 22, a content rate of oxygen is less than the content rate of oxygen in the stoichiometric composition.

Figure 3A:
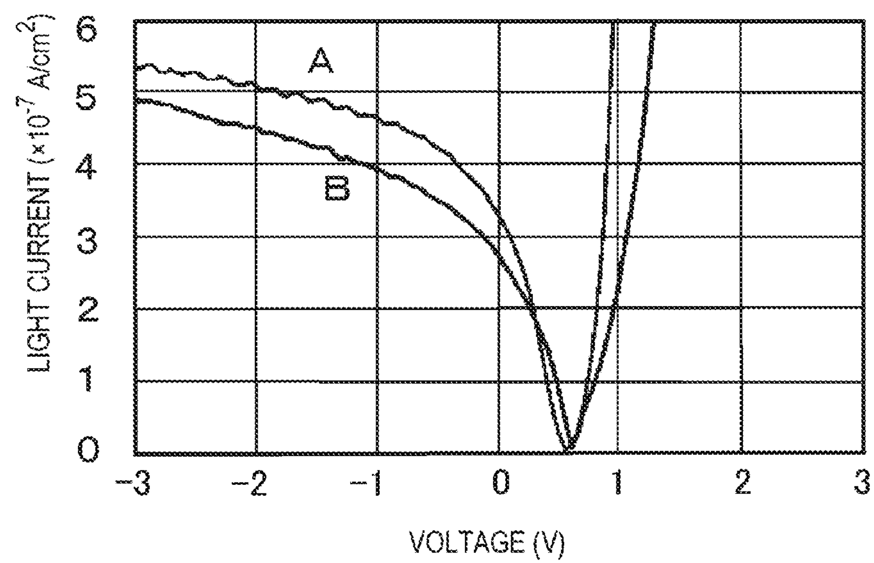
FIG. 3A and FIG. 3B are graphs of I-V curve each obtained from the imaging elements and the like of the first embodiment and a first comparative example.
Figure 3B:
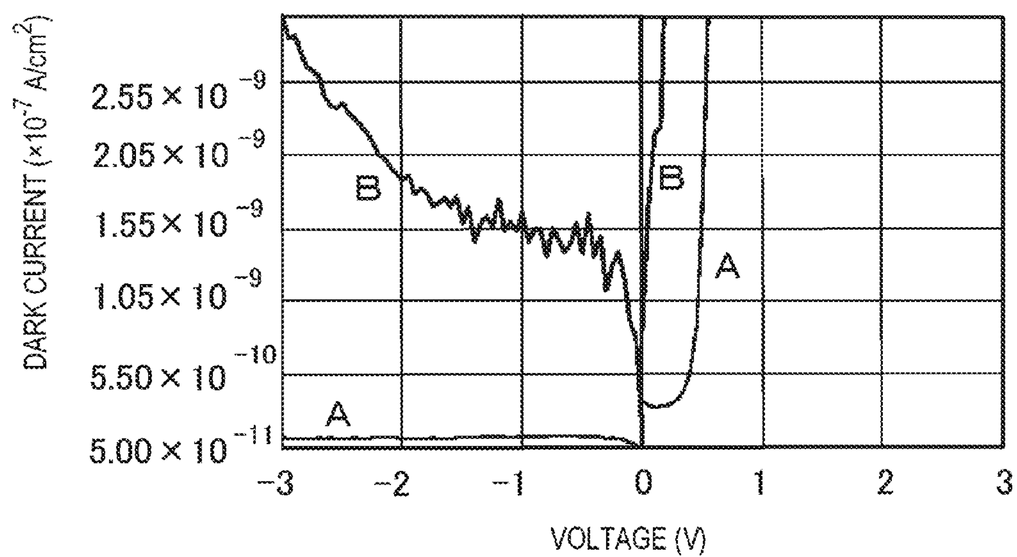

FIG. 3A and FIG. 3B illustrate an I-V curve obtained from the imaging element and the electronic device (the photoelectric conversion element) of the first embodiment, which includes the second electrode 22 made of IZO, and an imaging element and an electronic device (a photoelectric conversion element) of a first comparative example. Note that, FIG. 3A illustrates a light current while FIG. 3B illustrates a dark current. Additionally, "A" in FIG. 3A and FIG. 3B indicates measurement results of the imaging element and the electronic device of the first embodiment, and "B" indicates measurement results of the imaging element and the electronic device of the first comparative example. Here, the electronic device of the first comparative example is constituted of the second electrode 22 in the electronic device of the first embodiment made of ITO instead of IZO. Besides, the imaging element and the electronic device of the first embodiment described below include the second electrode 22 made of IZO.

From FIG. 3B, the imaging element and the electronic device of the first embodiment hardly change up to a reverse-bias voltage of 5 volts (FIG. 3B illustrates the reverse-bias voltage up to 3 volts). That is, when 0 volts are applied between the first electrode 21 and the second electrode 22, a value of the dark current flowing between the first electrode 21 and the second electrode 22 is assumed as $J_{d-0}$ (ampere), and when 5 volts are applied (when the reverse-bias voltage of -5 volts are applied) between the first electrode 21 and the second electrode 22, the value of the dark current flowing between the first electrode 21 and the second electrode 22 is assumed as $J_{d-5}$ (ampere). Then, $0.8\leq J_{d-5}/J_{d-0}\leq1.2$ is met. Additionally, when a voltage exceeding 0 volts or 5 volts or less (the reverse-bias voltage) is applied between the first electrode 21 and the second electrode 22, the value of the dark current flowing between the first electrode 21 and the second electrode 22 is assumed as $J_d$ (ampere), $0.8\leq J_d/J_{d-0}\leq1.2$ is met.

Additionally, values of the internal quantum efficiency of the electronic devices of the first embodiment and first comparative example and values of an on/off ratio were as shown in the following Table 1. Note that, an internal quantum efficiency η is a ratio of the number of generated electrons with respect to the number of incident photons and can be expressed by the following formula.

$$\eta=\{(h\cdot c)/(q\cdot\lambda)\}(I/P)=(1.24/\lambda)(I/P)$$

Here,
h: Planck's constant
c: velocity of light
q: electric charge of electron
A: wavelength of incident light (μm)
I: light current and a current value obtained at the reverse-bias voltage of 1 bolt at the measurement in the first embodiment (ampere/cm$^2$)
P: power of incident light (ampere/cm$^2$)

Further, Table 2 shows measurement results of the surface roughness Ra and Rq and measurement results of the optical transmittance of the second electrodes 22 of the first embodiment and the first comparative example.

TABLE 1

| | Internal quantum efficiency | On/off ratio |
|---|---|---|
| First embodiment | 63 | 3.4 |
| First comparative example | 45 | 1.6 |

TABLE 2

| | First embodiment | First comparative example |
|---|---|---|
| Ra | 0.36 nm | 2.5 nm |
| Rq | 0.46 nm | 3.6 nm |
| Optical transmittance with wavelength of 450 nm | 93% | 78% |
| Optical transmittance with wavelength of 550 nm | 88% | 84% |

Figure 4A:
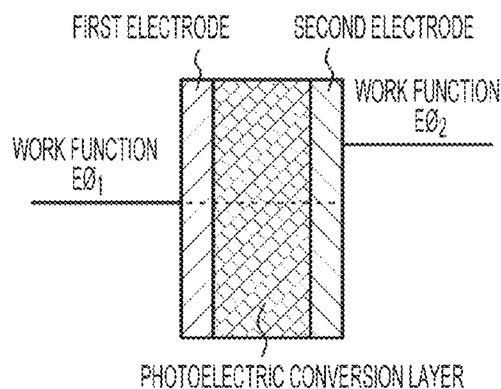
FIG. 4A and FIG. 4B are each conceptual diagrams for energy diagram of the imaging element and the like of the first embodiment and the first comparative example.
Figure 4B:
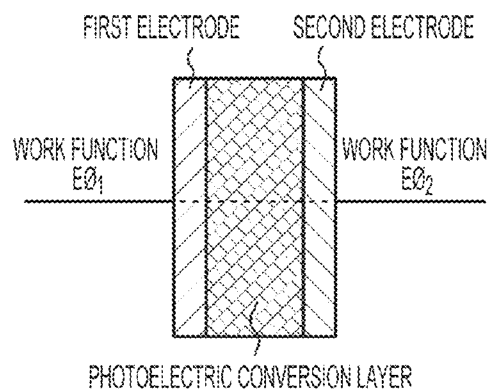
Figure 4C:
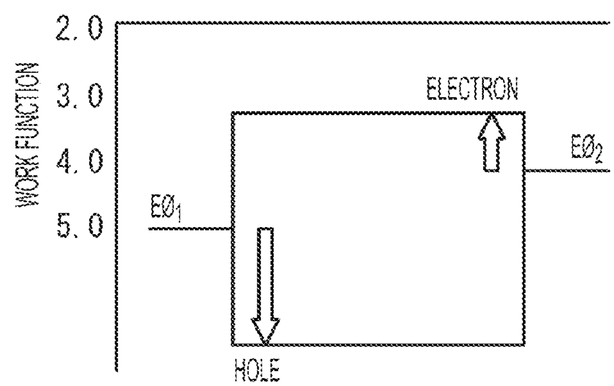
FIG. 4C and FIG. 4D are each conceptual diagrams illustrating a correlation between a difference in a value of the work function and the energy diagram of the imaging element and the like of the first embodiment and the first comparative example.
Figure 4D:
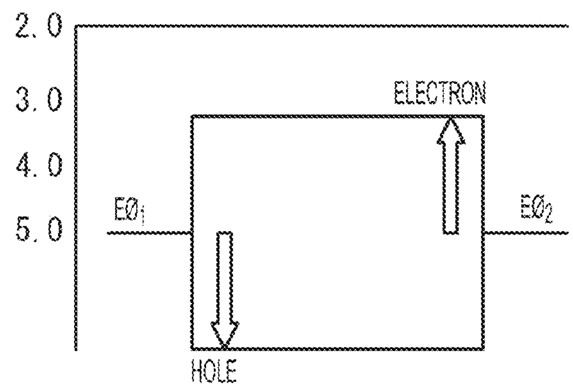

Since the electronic device of the first comparative example includes the second electrode and the first electrode both made of ITO, as FIG. 4B illustrates a conceptual diagram of energy diagram, there is no difference between the value of the work function of the first electrode and the value of the work function of the second electrode. Therefore, the holes from the first electrode easily flow into the second electrode, and consequently, the dark current increases. Additionally, since there is no difference between the value of the work function of the first electrode and the value of the work function of the second electrode, when the electrons and the holes are extracted, a potential gradient is absent (that is, the internal electric field does not occur in the light-receiving layer or the like). This makes it difficult to smoothly extract the electrons and the holes (see the conceptual diagram in FIG. 4D). On the other hand, the electronic device of the first embodiment includes the second electrode made of IZO and the first electrode made of ITO. The difference between the value of the work function of the first electrode and the value of the work function of the second electrode is 0.4 eV or more. FIG. 4A illustrates the conceptual diagram of the energy diagram. Therefore, as a result of ensuring a prevention of the holes from the first electrode flowing into the second electrode, the generation of the dark current can be restrained. Additionally, since the difference between the value of the work function of the first electrode and the value of the work function of the second electrode is 0.4 eV or more, the potential gradient is generated at the extraction of the electrons and the holes (that is, the internal electric field occurs in the light-receiving layer or the like). This ensures the smooth extraction of the electrons and the holes applying this potential gradient (see the conceptual diagram in FIG. 4C)

Figure 5:
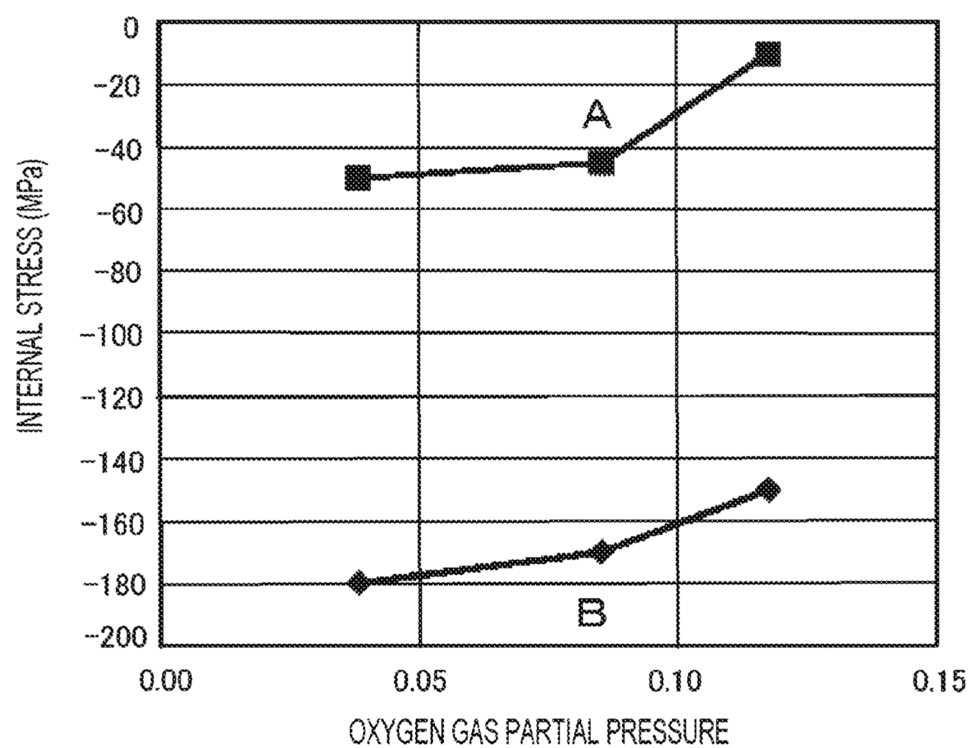
FIG. 5 is a graph illustrating results of examining a relationship between an oxygen gas partial pressure and an internal stress in a laminated structure during formation of the second electrode of the first embodiment.

Additionally, the relationship between the oxygen gas partial pressure and the internal stress of the laminated structure during the film formation of the second electrode 22 was examined. As a sputtering device, the parallel corrugated sheet sputtering device or the DC magnetron sputtering device was employed, argon (Ar) gas was used as process gas, and an InZnO sintered body was used as a target. FIG. 5 illustrates the result. Here, the horizontal axis in FIG. 5 indicates the oxygen gas partial pressure<=($O_2$ gas pressure)/(sum of Ar gas and $O_2$ gas pressures)>, and the vertical axis indicates the internal stress of the laminated structure (unit: MPa). Additionally, the data illustrated in FIG. 5 is data of the laminated structure obtained by forming the first electrode made of ITO with thickness of 100 nm, the light-receiving layer or the like made of quinacridone with thickness of 100 nm, and the second electrode (the first embodiment) made of IZO, amorphous oxide, with thickness of 100 nm or the second electrode (the first comparative example) made of ITO, crystal oxide, with thickness of 100 nm on a glass substrate in this order. Note that, the IZO film or the ITO film was formed at room temperature (specifically, 22° C. to 28° C.) by the sputtering method. Further, the laminated structure was formed on a silicon wafer. The internal stress was measured by a well-known method using a commercially available thin film stress measuring device.

Figure 6A:
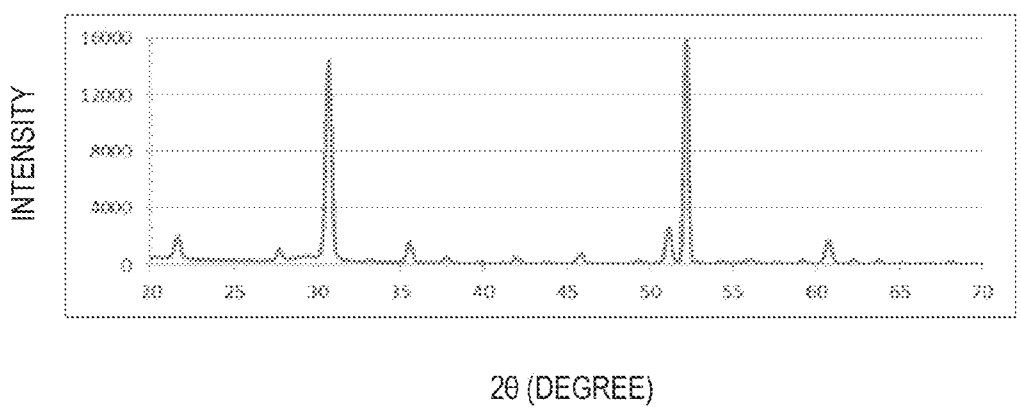
FIG. 6A and FIG. 6B are charts each illustrating results of X-ray diffraction analysis of the second electrode of the first comparative example and the first embodiment.
Figure 6B:
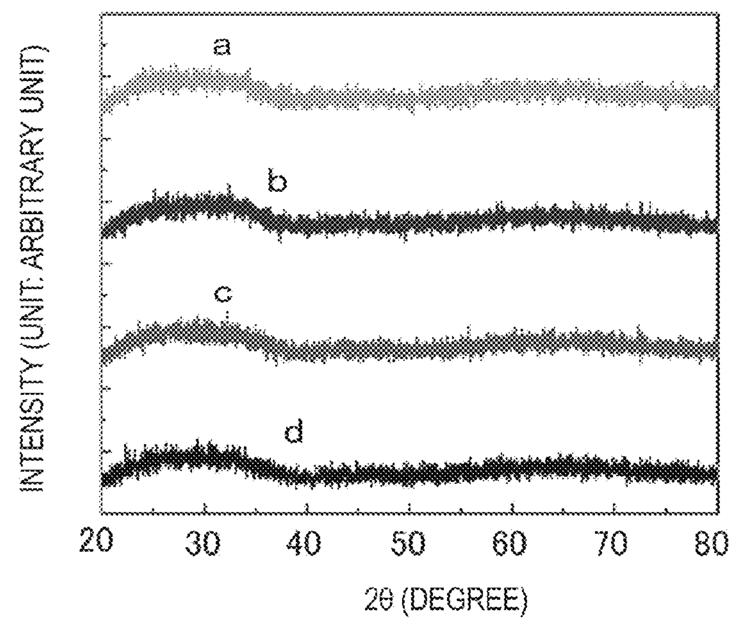

Further, the obtained second electrode was provided for X-ray diffraction test. FIG. 6A and FIG. 6B illustrate the results. Note that, FIG. 6A is a chart illustrating the X-ray diffraction analysis results of the second electrode of the first comparative example. FIG. 6B is a chart illustrating the X-ray diffraction analysis results of the second electrode of the first embodiment. It is found from FIG. 6B that, the second electrode of the first embodiment is amorphism regardless of the film forming condition. Additionally, it is found from FIG. 6A that, the second electrode of the first comparative example has high crystalline. Note that, "a," "b," "c," and "d" for the charts in FIG. 6B indicate a difference in film forming condition. The chart "a" indicates data with a sputtering input electric power of 200 watts. The chart "b" indicates data with the sputtering applying electric power of 150 watts. The chart "c" indicates data with the sputtering applying electric power of 100 watts. The chart "d" indicates data with the sputtering applying electric power of 50 watts.

Additionally, it is found from FIG. 5 that, with the imaging element and the electronic device of the first embodiment, the laminated structure has the internal stress with the compressive stress of 10 MPa to 50 MPa. On the other hand, with the imaging element and the electronic device of the first comparative example, it is found that the laminated structure has the internal stress with considerably high compressive stress, 150 MPa to 180 MPa. Respective samples of the laminated structures formed on the silicon wafer to measure the stress were dipped in acetone for 30 seconds. After that, using an optical microscope (scaling factor: 5 powers), a state of insulating layers was observed. Consequently, the first embodiment had no change before and after the dipping. Meanwhile, in the first comparative example, a peeling was partially recognized between the light-receiving layer or the like and the second electrode. Thus, the test has found that, constituting the second electrode 22 by amorphous oxide allows reliably restraining the stress damage in the light-receiving layer or the like during the formation of the second electrode 22.

Next, the second electrode of the first embodiment was examined for sealing property. Specifically, the second electrode was evaluated for permeability. For the evaluation on permeability, specifically, a Low Temperature Oxide (LTO, a low temperature CVD-$SiO_2$) film with thickness of 0.1 μm was formed on a silicon semiconductor substrate. A transparent conductive material constituting the second electrode was formed on this LTO film. Then, being left under the atmosphere, an amount of warp, which occurs and changes over time by absorbing water vapor in atmosphere by the LTO film via the transparent conductive material, of the laminated structures formed of the silicon semiconductor substrate, the LTO film, and the transparent conductive material was measured.

Figure 9A:
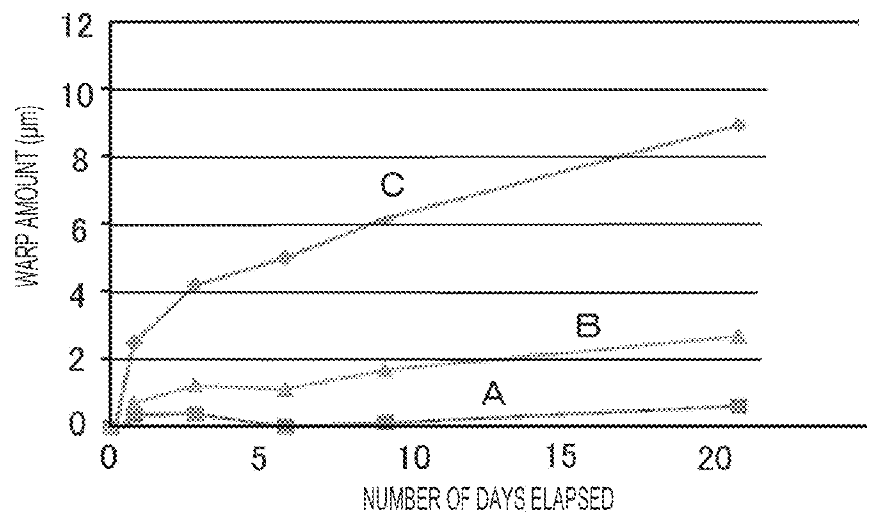
FIG. 9A is a graph illustrating measurement results of an amount of warp of a laminated structure formed of a silicon semiconductor substrate, an LTO film, and a transparent conductive material.

FIG. 9A illustrates measurement results the amount of warp in the ITO film and the IZO films with different internal stress. Here, in FIG. 9A, "A" indicates the measurement result of the IZO film with internal stress of −10 MPa (the compressive stress: 10 MPa), "B" indicates the measurement result of the IZO film with internal stress of −50 MPa (the compressive stress: 50 MPa), and "C" indicates the measurement result of the ITO film with internal stress of −250 MPa (the compressive stress: 250 MPa). It is found that, compared with the ITO film, the IZO film has the high sealing property (the low permeability).

Figure 9B:
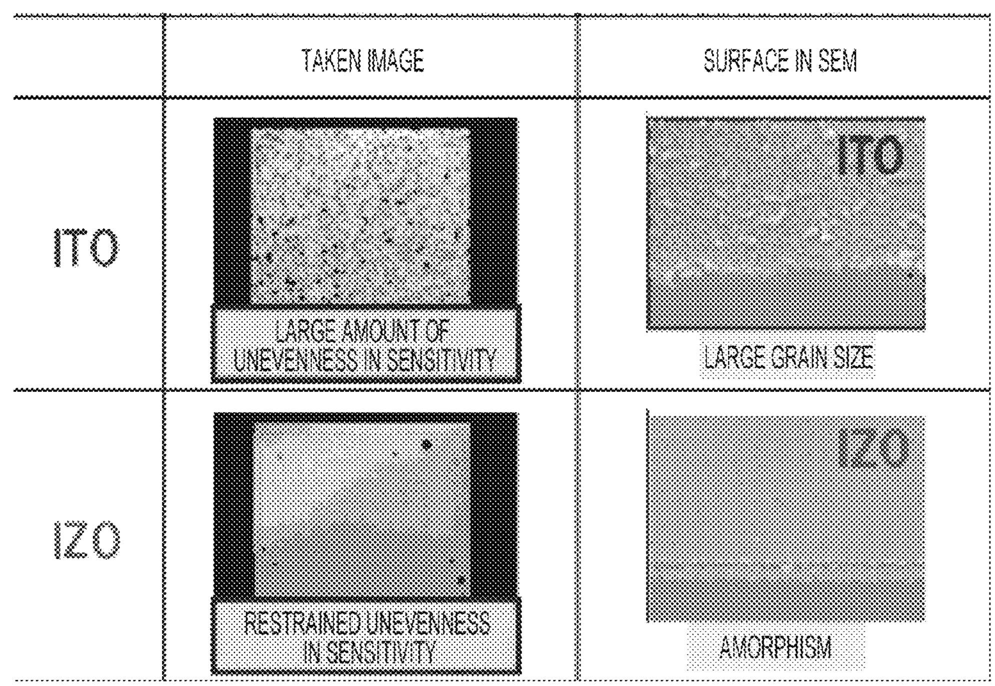
FIG. 9B is results of taking images of the imaging element with the second electrode constituted of an IZO film and an ITO film and scanning electron micrographs of a surface of the second electrode.

The imaging elements that include the second electrode (the imaging element of the first embodiment and the imaging element of the first comparative example) were prototyped from the respective IZO film with internal stress of −250 MPa and ITO film with internal stress of −50 MPa. FIG. 9B illustrates results of taking images of imaging devices constituted of these imaging elements. FIG. 9B also illustrates scanning electron micrographs of surfaces of the IZO film and the ITO film. From FIG. 9B, it is apparent that the result of image-taking of the imaging element of the first embodiment, which includes the second electrode constituted of the IZO film, substantially improves unevenness in sensitivity compared with the result of image-taking of the imaging element of the first comparative example that includes the second electrode constituted of the ITO film. It is considered that the improvement in sealing property (the deterioration in permeability) owing to the amorphous IZO film substantially contributes to the reduction in unevenness in sensitivity. Besides, it is considered that, from the scanning electron micrographs of the surfaces, since the ITO film has the crystalline, the water vapor is likely to enter easily. Meanwhile, the IZO film is amorphous and therefore is uniform, thereby restraining the entrance of the water vapor.

The case where the second electrode 22 is made of IGZO instead of IZO also obtained the result similar to the above-described result.

As described above, since the imaging element and the electronic device of the first embodiment include the transparent second electrode with conductive property, the incident light can reliably reach the light-receiving layer or the like. Moreover, since the second electrode is made of the amorphous oxide, the internal stress decreases at the second electrode. Accordingly, even without forming a stress buffer layer, which has complex configuration and structure, the stress damage is less likely to occur in the light-receiving layer or the like during the formation of the second electrode. Moreover, with the imaging element and the electronic device of the first embodiment, since the difference between the value of the work function of the first electrode and the value of the work function of the second electrode is specified, when the bias voltage (more specifically, the reverse-bias voltage) is applied between the second electrode and the first electrode, the large internal electric field can be generated in the light-receiving layer or the like on the basis of the difference in the values of the work functions. As a result of this, the improvement can be achieved in the internal quantum efficiency, that is, an increase in photo current can be achieved, and also the dark current can be restrained. Besides, since the surface of the second electrode is considerably smooth, a surface diffuse reflectance in the second electrode can be restrained. As a result, a surface reflection of light entering the second electrode is reduced. This ensures restraining the loss of amount of light of the light entering the light-receiving layer or the like via the second electrode, thereby ensuring further improving the light current characteristic in the photoelectric conversion. Further, the second electrode of the first embodiment has the high sealing property and the low permeability, thereby substantially improving the unevenness in sensitivity of the imaging element and the electronic device of the first embodiment.

Second Embodiment

Figure 1C:
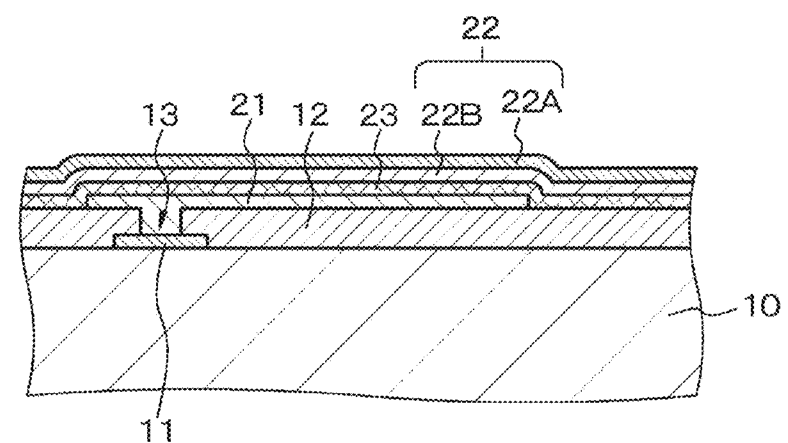
FIG. 1C is a schematic, partial cross-sectional view of an imaging element and the like of a second embodiment.

The second embodiment is a modification of the first embodiment. FIG. 1C illustrates a schematic, partial cross-sectional view of the electronic device of the second embodiment.

The electronic device of the second embodiment includes the second electrode 22 having a laminated structure of a second B layer 22B and a second A layer 22A from a light-receiving layer or the like side. A value of the work function of the second A layer 22A in the second electrode 22 is lower than a value of the work function of the second B layer 22B in the second electrode 22. Specifically, a difference between the value of the work function of the second A layer 22A in the second electrode 22 and the value of the work function of the second B layer 22B in the second electrode 22 is 0.1 eV to 0.2 eV, more specifically, 0.15 eV. A difference between the value of the work function of the first electrode 21 and the value of the work function of the second A layer 22A in the second electrode 22 is 0.4 eV or more. Additionally, the thickness of the second electrode 22 is $1\times10^{-8}$ m to $1.5\times10^{-7}$ m, specifically, 50 nm, and the ratio of the thickness of the second A layer 22A in the second electrode 22 to the thickness of the second B layer 22B in the second electrode 22 is 9/1 to 1/9, specifically, 9/1. In the second embodiment as well, setting the difference between the value of the work function of the first electrode 21 and the value of the work function of the second A layer 22 in the second electrode 22 to 0.4 eV or more generates the internal electric field on the light-receiving layer or the like on the basis of the difference in the values of the work functions, thus achieving the improvement in internal quantum efficiency. Here, assume that a composition of the second A layer 22A as $In_a (Ga, Al)_b Zn_c O_d$ and a composition of the second B layer 22B as $In_{a'} (Ga, Al)_{b'} Zn_{c'} O_{d'}$, a=a', b=b', and c=c', and further d<d' is met.

In a method for forming the electrode for the electronic device of the second embodiment, in a process similar to [Process-110] in the first embodiment, for example, as illustrated in the graph in FIG. 2, controlling the amount of introduced oxygen gas during the formation by the sputtering method controls the values of the work functions of the second A layer 22A and the second B layer 22B in the second electrode 22.

With the electronic device of the second embodiment, the second electrode is constituted of the second A layer and the second B layer and further the difference between the work functions of the second A layer and the second B layer is specified. This ensures achieving the optimization of the work functions in the second electrode, further easing the exchange (the movement) of the carriers.

[Third Embodiment]

The third embodiment relates to a solid-state imaging device of the present disclosure. The solid-state imaging device of the third embodiment includes the plurality of imaging elements (the photoelectric conversion elements) of the first embodiment and the second embodiment.

Figure 7:
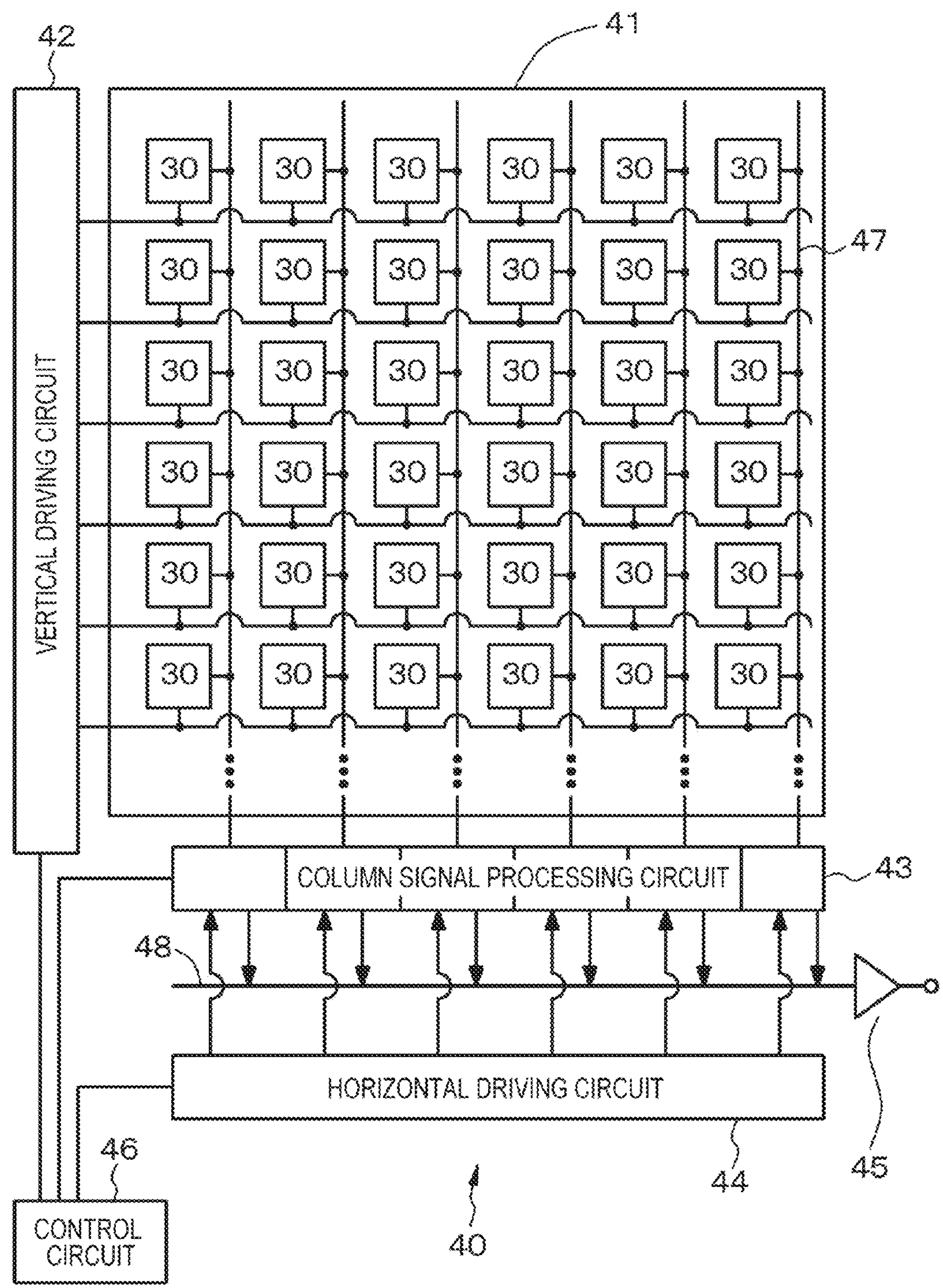
FIG. 7 is a conceptual diagram of a solid-state imaging device of a third embodiment.
Figure 8:
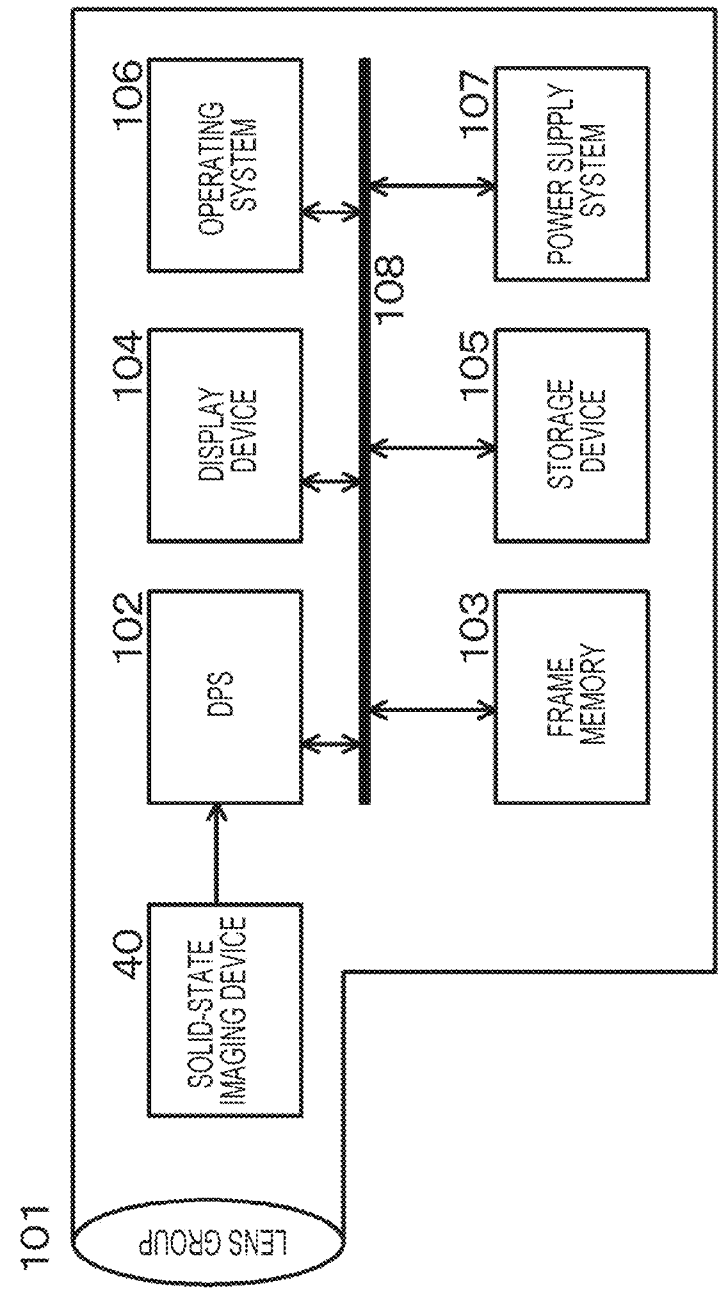
FIG. 8 is a diagram illustrating a configuration of the solid-state imaging device of the third embodiment.

FIG. 7 illustrates the conceptual diagram of the solid-state imaging device of the third embodiment, and FIG. 8 illustrates the configuration of the solid-state imaging device of the third embodiment. An imaging device 100 of the third embodiment is constituted of a solid-state imaging device and well-known lens group 101, digital signal processor (DSP) 102, frame memory 103, display device 104, storage device 105, operating system 106, and power supply system 107. These members are electrically connected with a bus line 108. Then, the solid-state imaging device 40 of the third embodiment is constituted of an imaging area 41 where the imaging elements described in the first embodiment and the second embodiment are arranged in a two-dimensional array pattern on the semiconductor substrate (for example, the silicon semiconductor substrate), a vertical driving circuit 42, column signal processing circuits 43, a horizontal driving circuit 44, an output circuit 45, and a control circuit 46 as its peripheral circuits, and the like. Note that, it is obvious that these circuits can be constituted of well-known circuits or can be constituted using another circuit configuration (for example, various circuits used in conventional CCD imaging device and CMOS imaging device).

The control circuit 46 generates a clock signal and a control signal serving as a reference for operations of the vertical driving circuit 42, the column signal processing circuits 43, and the horizontal driving circuit 44 on the basis of a vertical synchronization signal, a horizontal synchronization signal, and a master clock. Then, the generated clock signal and control signal are input to the vertical driving circuit 42, the column signal processing circuits 43, and the horizontal driving circuit 44.

The vertical driving circuit 42 is, for example, constituted of a shift register and sequentially selects and scans the respective imaging elements 30 in the imaging area 41 in a vertical direction in units of rows. Then, a pixel signal based on a current (a signal) generated according to an amount of received light in each imaging element 30 is transmitted to the column signal processing circuit 43 via a vertical signal line 47.

The column signal processing circuits 43 are, for example, disposed for each column of the imaging elements 30. Noise removal and signal processing to amplify the signals are performed on signals output from the imaging elements 30 in one row by signals from black reference pixels (although not illustrated, the black reference pixels are formed at a peripheral area of a valid pixel area). At an output stage of the column signal processing circuit 43, a horizontal selection switch (not illustrated) is disposed coupled between the column signal processing circuit 43 and a horizontal signal line 48.

The horizontal driving circuit 44 is, for example, constituted of the shift register. Sequentially outputting horizontal scanning pulses sequentially selects each of the column signal processing circuits 43 and outputs signals from the respective column signal processing circuits 43 to the horizontal signal lines 48.

The output circuit 45 performs signal processing on signals sequentially supplied from the respective column signal processing circuits 43 via the horizontal signal lines 48 and outputs the signals.

Although depending on the material constituting the light-receiving layer or the like, since the light-receiving layer or the like itself can have a configuration functioning as a color filter. This ensures separating colors without disposing a color filter. However, depending on the case, a well-known color filter to transmit a specific wavelength such as red, green, blue, cyan, magenta, and yellow may be disposed at the upper side of the imaging elements 30 on a light-incident side. Besides, the solid-state imaging device can be a front surface illuminated type and also can be a back surface illuminated type. Additionally, as necessary, a shutter to control the incident light to the imaging element may be disposed.

This disclosure has been described above on the basis of the preferable embodiments; however, the present disclosure is not limited to these embodiments. The structures, the configurations, the manufacturing conditions, the manufacturing methods, and the materials used for the imaging element, the electronic device, and the solid-state imaging device described in the embodiments are examples and can be appropriately changed. To cause the electronic device of the present disclosure to function as a solar cell, it is only necessary to irradiate the light-receiving layer or the like with light in a state where the voltage is not applied between the second electrode and the first electrode. Additionally, the optical sensor and the image sensor can be configured with the electronic device of the present disclosure.

Note that, the following configurations are also applicable to the present disclosure.

[A01]<<Imaging Element>>

An imaging element including a laminated structure including a first electrode, a light-receiving layer formed on the first electrode, and a second electrode formed on the light-receiving layer, wherein the second electrode is made of a transparent amorphous oxide having a conductive property.

[A02]The imaging element according to [A01], wherein assuming that a value of a dark current flowing between the first electrode and the second electrode is $J_{d-0}$ (ampere) when 0 volts are applied between the first electrode and the second electrode, and assuming that a value of the dark current flowing between the first electrode and the second electrode is $J_{d-5}$ (ampere) when 5 volts are applied between the first electrode and the second electrode, $0.8 \leq J_{d-5}/J_{d-0} \leq 1.2$ is met.

[A03] The imaging element according to [A01] or [A02], wherein the laminated structure has an internal stress with compressive stress of 10 MPa to 50 MPa.

[A04] The imaging element according to any one of [A01] to [A03], wherein the second electrode has a surface roughness Ra of 1.5 nm or less and Rq of 2.5 nm or less.

[A05] The imaging element according to any one of [A01] to [A04], wherein the second electrode has a work function of 4.5 eV or less.

[A06] The imaging element according to [A05], wherein the second electrode has a value of the work function of 4.1 eV to 4.5 eV.

[A07] The imaging element according to any one of [A01] to [A06], wherein the second electrode has an optical transmittance of 75% or more with respect to light with wavelength of 400 nm to 660 nm.

[A08] The imaging element according to any one of [A01] to [A07], wherein the second electrode has an electric resistance value of $1\times10^{-6}\Omega\cdot cm$ or less.

[A09] The imaging element according to any one of [A01] to [A08], wherein the sheet resistance value of the second electrode is $3\times10\Omega/\square$ to $1\times10^{3}\Omega/\square$.

[A10] The imaging element according to any one of [A01] to [A09], wherein the second electrode has a thickness of $1\times10^{-8}$ m to $1.5\times10^{-7}$ m.

[A11] The imaging element according to [A10], wherein the second electrode has the thickness of $2\times10^{-8}$ m to $1\times10^{-7}$ m.

[A12] The imaging element according to any one of [A01] to [A11], wherein the second electrode is made of a material formed by adding or doping at least one kind of material selected from the group consisting of aluminum, gallium, tin, and indium to one kind of material selected from the group consisting of indium oxide, tin oxide, and zinc oxide.

[A13] The imaging element according to any one of [A01] to [A11], wherein the second electrode is made of $In_a(Ga, Al)_bZn_cO_d$.

[A14] The imaging element according to [A12] or [A13], wherein a difference between a value of a work function of the second electrode and a value of the work function of the first electrode is 0.4 eV or more.

[A15] The imaging element according to [A14], wherein setting the difference between the value of the work function of the second electrode and the value of the work function of the first electrode to 0.4 eV or more generates an internal electric field in the light-receiving layer on the basis of the difference in the values of the work functions and achieves improvement in internal quantum efficiency.

[A16] The imaging element according to [A13], wherein the second electrode has a laminated structure of a second B layer and a second A layer from the light-receiving layer side, and a value of a work function of the second A layer in the second electrode is lower than a value of the work function of the second B layer in the second electrode.

[A17] The imaging element according to [A16], wherein a difference between the value of the work function of the second A layer in the second electrode and the value of the work function of the second B layer in the second electrode is 0.1 eV to 0.2 eV.

[A18] The imaging element according to [A16] or [A17], wherein a difference between a value of the work function of the first electrode and the value of the work function of the second A layer in the second electrode is 0.4 eV or more.

[A19] The imaging element according to [A18], wherein setting the difference between the value of the work function of the first electrode and the value of the work function of the second A layer in the second electrode to 0.4 eV or more generates an internal electric field in the light-receiving layer on the basis of the difference in the values of the work functions and achieves improvement in internal quantum efficiency.

[A20] The imaging element according to any one of [A16] to [A19], wherein the thickness of the second electrode is $1\times10^{-8}$ m to $1.5\times10^{-7}$ m and a ratio of a thickness of a second A layer of the second electrode to a thickness of a second B layer of the second electrode is 9/1 to 1/9.

[A21] The imaging element according to any one of [A01] to [A20], wherein the second electrode is made of indium-gallium oxide, indium-doped gallium-zinc oxide, aluminum oxide-doped zinc oxide, indium-zinc oxide, or gallium-doped zinc oxide.

[A22] The imaging element according to any one of [A01] to [A21], wherein the first electrode is made of indium-tin oxide, indium-zinc oxide, or tin oxide.

[A23] The imaging element according to any one of [A01] to [A22], wherein controlling an amount of introduced oxygen gas to form the second electrode by a sputtering method controls the value of the work function of the second electrode.

[A24] The imaging element according to any one of [A01] to [A23], wherein a content rate of oxygen in the second electrode is less than a content rate of oxygen in a stoichiometric composition.

[B01]<<Solid-state Imaging Device>>

A solid-state imaging device including a plurality of imaging elements, wherein the imaging elements each have a laminated structure including a first electrode, alight-receiving layer formed on the first electrode, and a second electrode formed on the light-receiving layer, and the second electrode is made of a transparent amorphous oxide having a conductive property.

[B02] A solid-state imaging device includes the plurality of imaging elements according to any one of [A01] to [A24].

[C01] An electronic device including a laminated structure including a first electrode, a light-emitting/light-receiving layer formed on the first electrode, and a second electrode formed on the light-emitting/light-receiving layer, wherein the second electrode is made of a transparent amorphous oxide having a conductive property.

[C02] The electronic device according to [C01], wherein assuming that a value of a dark current flowing between the first electrode and the second electrode is $J_{d-0}$ (ampere) when 0 volts are applied between the first electrode and the second electrode, and assuming that a value of the dark current flowing between the first electrode and the second electrode is $J_{d-5}$ (ampere) when 5 volts are applied between the first electrode and the second electrode, $0.8\leq J_{d-5}/J_{d-0}\leq1.2$ is met.

[C03] The electronic device according to [C01] or [C02], wherein the laminated structure has an internal stress with compressive stress of 10 MPa to 50 MPa.

[C04] The electronic device according to any one of [C01] to [C03], wherein the second electrode has a surface roughness Ra of 1.5 nm or less and Rq of 2.5 nm or less.

[C05] The electronic device according to any one of [C01] to [C04], wherein the second electrode has a work function of 4.5 eV or less.

[C06] The electronic device according to [C05], wherein the second electrode has a value of the work function of 4.1 eV to 4.5 eV.

[C07] The electronic device according to any one of [C01] to [C06], wherein the second electrode has an optical transmittance of 75% or more with respect to light with wavelength of 400 nm to 660 nm.

[C08] The electronic device according to any one of [C01] to [C07], wherein the second electrode has an electric resistance value of $1\times10^{-6}\Omega\cdot cm$ or less.

[C09] The electronic device according to any one of [C01] to [C08], wherein the sheet resistance value of the second electrode is $3\times10\Omega/\square$ to $1\times10^{3}\Omega/\square$.

[C10] The electronic device according to any one of [C01] to [C09], wherein the second electrode has a thickness of $1\times10^{-8}$ m to $1.5\times10^{-7}$ m.

[C11] The electronic device according to [C10], wherein the second electrode has the thickness of $2\times10^{-8}$ m to $1\times10^{-7}$ m.

[C12] The electronic device according to any one of [C01] to [C11], wherein the second electrode is made of a material formed by adding or doping at least one kind of material selected from the group consisting of aluminum, gallium, tin, and indium to one kind of material selected from the group consisting of indium oxide, tin oxide, and zinc oxide.

[C13] The electronic device according to any one of [C01] to [C11], wherein the second electrode is made of $In_a(Ga, Al)_bZn_cO_d$.

[C14] The electronic device according to [C12] or [C13], wherein a difference between a value of a work function of the second electrode and a value of the work function of the first electrode is 0.4 eV or more.

[C15] The electronic device according to [C14], wherein setting the difference between the value of the work function of the second electrode and the value of the work function of the first electrode to 0.4 eV or more generates an internal electric field in the light-receiving layer on the basis of the difference in the values of the work functions and achieves improvement in internal quantum efficiency.

[C16] The electronic device according to [C13], wherein the second electrode has a laminated structure constituted of a second B layer and a second A layer from the light-emitting/light-receiving layer side. A value of the work function of the second A layer in the second electrode is lower than a value of the work function of the second B layer in the second electrode.

[C17] The electronic device according to [C16], wherein a difference between the value of the work function of the second A layer in the second electrode and the value of the work function of the second B layer in the second electrode is 0.1 eV to 0.2 eV.

[C18] The electronic device according to [C16] or [C17], wherein a difference between a value of the work function of the first electrode and the value of the work function of the second A layer in the second electrode is 0.4 eV or more.

[C19] The electronic device according to [C18], wherein setting the difference between the value of the work function of the first electrode and the value of the work function of the second A layer in the second electrode to 0.4 eV or more generates an internal electric field in the light-emitting/light-receiving layer on the basis of the difference in the values of the work functions and achieves improvement in internal quantum efficiency.

[C20] The electronic device according to any one of [C16] to [C19], wherein the thickness of the second electrode is $1\times10^{-8}$ m to $1.5\times10^{-7}$ m and a ratio of a thickness of a second A layer of the second electrode to a thickness of a second B layer of the second electrode is 9/1 to 1/9.

[C21] The electronic device according to any one of [C01] to [C20], wherein the second electrode is made of indium-gallium oxide, indium-doped gallium-zinc oxide, aluminum oxide-doped zinc oxide, indium-zinc oxide, or gallium-doped zinc oxide.

[C22] The electronic device according to any one of [C01] to [C21], wherein the first electrode is made of indium-tin oxide, indium-zinc oxide, or tin oxide.

[C23] The electronic device according to any one of [C01] to [C22], wherein controlling an amount of introduced oxygen gas to form the second electrode by a sputtering method controls the value of the work function of the second electrode.

[C24] The electronic device according to any one of [C01] to [C23], wherein a content rate of oxygen in the second electrode is less than a content rate of oxygen in a stoichiometric composition.

REFERENCE SIGNS LIST

10 Substrate
11 Wiring
12 Insulating layer
13 Opening
21 First electrode
22 Second electrode
22A Second A layer in second electrode
22B Second B layer in second electrode
23 Light-receiving layer or light-emitting/light-receiving layer (light-receiving layer or the like)
30 Imaging element
40 Solid-state imaging device
41 Imaging area
42 Vertical driving circuit
43 Column signal processing circuit
44 Horizontal driving circuit
45 Output circuit
46 Control circuit
47 Vertical signal line
48 Horizontal signal line
101 Lens group
102 Digital signal processor (DSP)
103 Frame memory
104 Display device
105 Storage device
106 Operating system
107 Power supply system
108 Bus line

What is claimed is:

1. An imaging element comprising:

a laminated structure including a first electrode, a light-receiving layer formed on the first electrode, and a second electrode formed on the light-receiving layer, wherein the second electrode is made of a transparent amorphous oxide having a conductive property, and wherein assuming that a value of a dark current flowing between the first electrode and the second electrode is $J_{d\text{-}0}$ (ampere) when 0 volts are applied between the first electrode and the second electrode, and assuming that a value of the dark current flowing between the first electrode and the second electrode is $J_{d-5}$ (ampere) when 5 volts are applied between the first electrode and the second electrode, $0.8 \leq J_{d-5}/J_{d-0} \leq 1.2$ is met.

2. The imaging element according to claim 1, wherein the second electrode has an optical transmittance of 75% or more with respect to light with a wavelength of 400 nm to 660 nm.

3. The imaging element according to claim 1, wherein the second electrode is made of a material formed by adding or doping at least one kind of material selected from the group consisting of aluminum, gallium, tin, and indium to one kind of material selected from the group consisting of indium oxide, tin oxide, and zinc oxide.

4. The imaging element according to claim 1, wherein the laminated structure has an internal stress with compressive stress of 10 MPa to 50 MPa.

5. The imaging element according to claim 1, wherein the second electrode has a surface roughness Ra of 1.5 nm or less and Rq of 2.5 nm or less.

6. The imaging element according to claim 2, wherein the second electrode has a work function of4.5 eV or less.

7. An imaging element comprising:
a laminated structure including a first electrode, a light-receiving layer formed on the first electrode, and a second electrode formed on the light-receiving layer,
wherein the second electrode is made of a transparent amorphous oxide having a conductive property, and
wherein the laminated structure has an internal stress with compressive stress of 10 MPa to 50 MPa.

8. An imaging element comprising:
a laminated structure including a first electrode, a light-receiving layer formed on the first electrode, and a second electrode formed on the light-receiving layer,
wherein the second electrode is made of a transparent amorophous oxide having a conductive property, and
wherein the second electrode has a surface roughness Ra of 1.5 nm or less and Rq of 2.5 nm or less.

9. An imaging element comprising:
a laminated structure including a first electrode, a light-receiving layer formed on the first electrode, and a second electrode formed on the light-receiving layer,
wherein the second electrode is made of a transparent amorphous oxide having a conductive property,
wherein the second electrode has a work function of 4.5 eV or less.

10. The imaging element according to claim 9, wherein the second electrode has a value of the work function of 4.1 eV to 4.5 eV.

11. An imaging element comprising:
a laminated structure including a first electrode, a light-receiving layer formed on the first electrode, and a second electrode formed on the light-receiving layer,
wherein the second electrode is made of a transparent amorphous oxide having a conductive property, and
wherein the second electrode has an electric resistance value of $1\times10^{-6}\Omega\cdot$cm or less.

12. An imaging element comprising:
a laminated structure including a first electrode, a light-receiving layer formed on the first electrode, and a second electrode formed on the light-receiving layer,
wherein the second electrode is made of a transparent amorphous oxide having a conductive property,
wherein the second electrode has a thickness of $1\times10^{-8}$ m to $1.5\times10^{-7}$ m.

13. The imaging element according to claim 12,
wherein the second electrode has the thickness of $2\times10^{-8}$ m to $1\times10^{-7}$ m.

14. An imaging element comprising:
a laminated structure including a first electrode, a light-receiving layer formed on the first electrode, and a second electrode formed on the light-receiving layer,
wherein the second electrode is made of a transparent amorphous oxide having a conductive property, and
wherein the second electrode is made of $In_a(Ga, Al)_bZn_cO_d$.

15. The imaging element according to claim 14,
wherein a difference between a value of a work function of the second electrode and a value of the work function of the first electrode is 0.4 eV or more.

16. The imaging element according to claim 15,
wherein setting the difference between the value of the work function of the second electrode and the value of the work function of the first electrode to 0.4 eV or more generates an internal electric field in the light-receiving layer on the basis of the difference in the values of the work functions and achieves improvement in internal quantum efficiency.

17. The imaging element according to claim 14,
wherein the second electrode has a laminated structure of a second B layer and a second A layer from the light-receiving layer side, and
a value of a work function of the second A layer in the second electrode is lower than a value of the work function of the second B layer in the second electrode.

18. The imaging element according to claim 17,
wherein a difference between the value of the work function of the second A layer in the second electrode and the value of the work function of the second B layer in the second electrode is 0.1 eV to 0.2 eV.

19. The imaging element according to claim 17,
wherein a difference between a value of the work function of the first electrode and the value of the work function of the second A layer in the second electrode is 0.4 eV or more.

20. The imaging element according to claim 17,
wherein setting the difference between the value of the work function of the first electrode and the value of the work function of the second A layer in the second electrode to 0.4 eV or more generates an internal electric field in the light-receiving layer on the basis of the difference in the values of the work functions and achieves improvement in internal quantum efficiency.

* * * * *